(12) United States Patent
Hallikainen

(10) Patent No.: US 11,011,985 B2
(45) Date of Patent: May 18, 2021

(54) VOLTAGE REDUCING CIRCUIT WITH PRE-BIASING CIRCUIT PORTION

(71) Applicant: NORDIC SEMICONDUCTOR ASA, Trondheim (NO)

(72) Inventor: Samuli Antti Hallikainen, Oslo (NO)

(73) Assignee: Nordic Semiconductor ASA, Trondheim (NO)

( * ) Notice: Subject to any disclaimer, the term of this patent is extended or adjusted under 35 U.S.C. 154(b) by 0 days.

(21) Appl. No.: 16/333,205

(22) PCT Filed: Sep. 13, 2017

(86) PCT No.: PCT/GB2017/052701
§ 371 (c)(1),
(2) Date: Mar. 13, 2019

(87) PCT Pub. No.: WO2018/051087
PCT Pub. Date: Mar. 22, 2018

(65) Prior Publication Data
US 2019/0222121 A1    Jul. 18, 2019

(30) Foreign Application Priority Data

Sep. 14, 2016    (GB) ..................................... 1615625

(51) Int. Cl.
*H02M 3/158*    (2006.01)
*H02M 1/38*    (2007.01)
(Continued)

(52) U.S. Cl.
CPC ............ *H02M 3/158* (2013.01); *G05F 3/262* (2013.01); *H02M 1/08* (2013.01); *H02M 1/38* (2013.01);
(Continued)

(58) Field of Classification Search
CPC ...... H02M 3/156; H02M 3/1588; H02M 1/08; H02M 1/38; H02M 2001/0003; H02M 2001/385; G05F 3/262; H03K 17/163
(Continued)

(56) References Cited

U.S. PATENT DOCUMENTS 4,570,128 A    2/1986  Monticelli
8,841,894 B1   9/2014  Naraghi et al.
(Continued)

FOREIGN PATENT DOCUMENTS

EP    2378648    10/2011

OTHER PUBLICATIONS

International Search and Written Report for PCT/GB2017/052701, dated Nov. 29, 2017, 14 pages.
(Continued)

*Primary Examiner* — Shawski S Ismail
*Assistant Examiner* — Monica Mata
(74) *Attorney, Agent, or Firm* — Klarquist Sparkman, LLP

(57) ABSTRACT

A voltage reducing circuit comprises a power switch circuit portion comprising a high-side and low-side field-effect-transistors connected at a switch node. The power switch circuit portion has an on-state wherein the high-side transistor is enabled and the low-side transistor is disabled and, vice versa, an off-state. An energy storage circuit portion comprising an inductor connected to the switch node is arranged to provide an output voltage. A drive circuit portion receives a pulse width modulation control signal and outputs pulse width modulated (PWM) drive signals. A pre-biasing circuit portion applies bias voltages to the gate terminals of the high-side and low-side transistors in response to the PWM drive signals, wherein the pre-biasing circuit portion is arranged such that the bias voltage applied to the gate
(Continued)

terminal of the currently disabled transistor is set to an intermediate voltage before switching between the on-state and off-state.

13 Claims, 5 Drawing Sheets

(51) Int. Cl.
*G05F 3/26* (2006.01)
*H02M 3/156* (2006.01)
*H02M 1/08* (2006.01)
*H03K 17/16* (2006.01)
*H02M 1/00* (2006.01)

(52) U.S. Cl.
CPC .......... H02M 3/156 (2013.01); H03K 17/163 (2013.01); *H02M 2001/0003* (2013.01); *H02M 2001/385* (2013.01)

(58) Field of Classification Search
USPC ........................................... 323/283
See application file for complete search history.

(56) References Cited

U.S. PATENT DOCUMENTS

| | | |
|---|---|---|
| 2008/0253151 A1 | 10/2008 | Bahramian |
| 2014/0062361 A1 | 3/2014 | Suzuki et al. |
| 2014/0103962 A1* | 4/2014 | Ajram ................ H03K 17/082 327/108 |
| 2014/0253186 A1 | 9/2014 | De Geeter et al. |

OTHER PUBLICATIONS

Search Report under Section 17(5) for GB1615625.9, dated Feb. 16, 2017, 3 pages.
Advanced Engineering Course on Power Management, Vadim Ivanov, MEAD training, EPFL, Lausanne, Sep. 3, 2010, 133 pages.

* cited by examiner

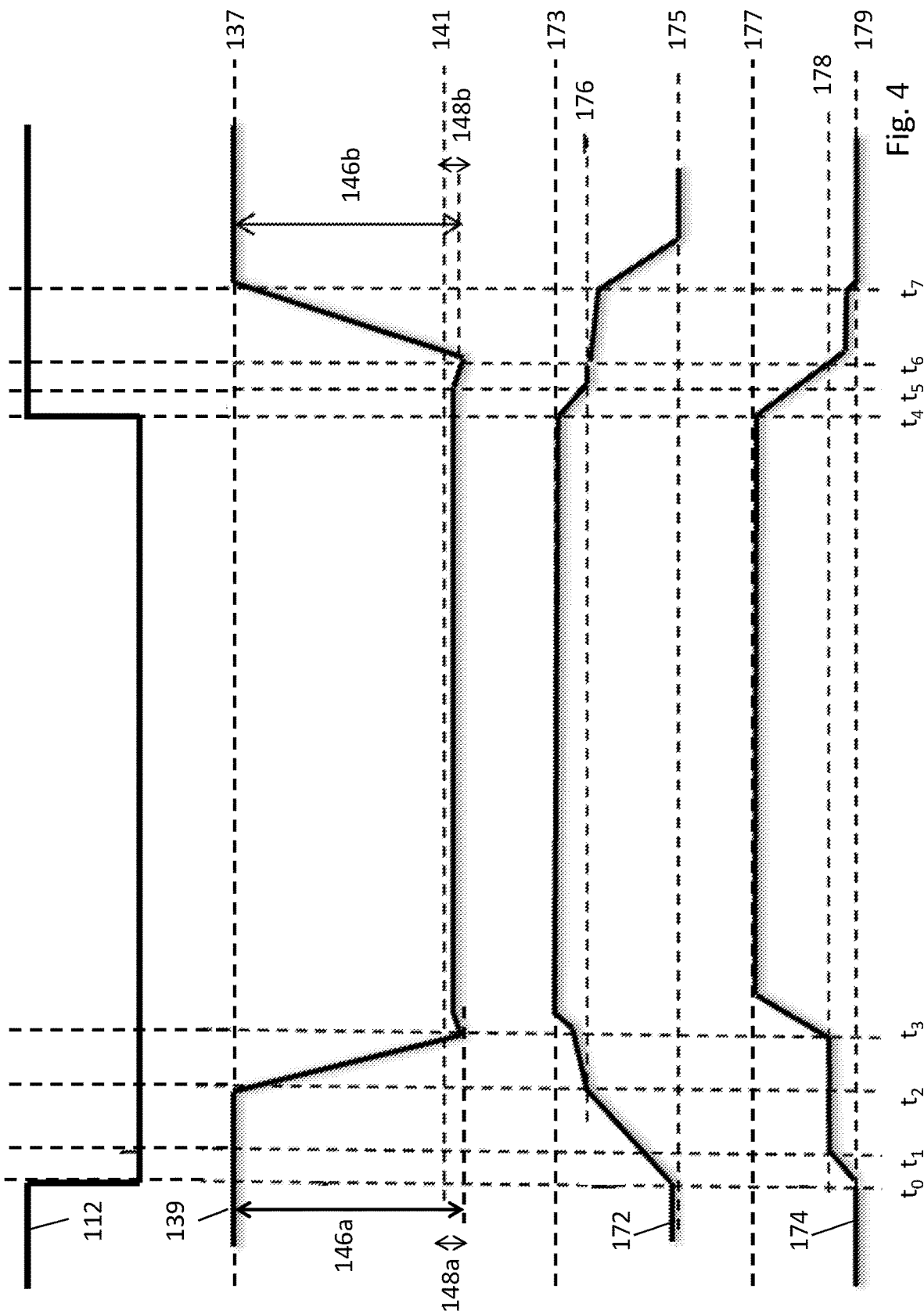

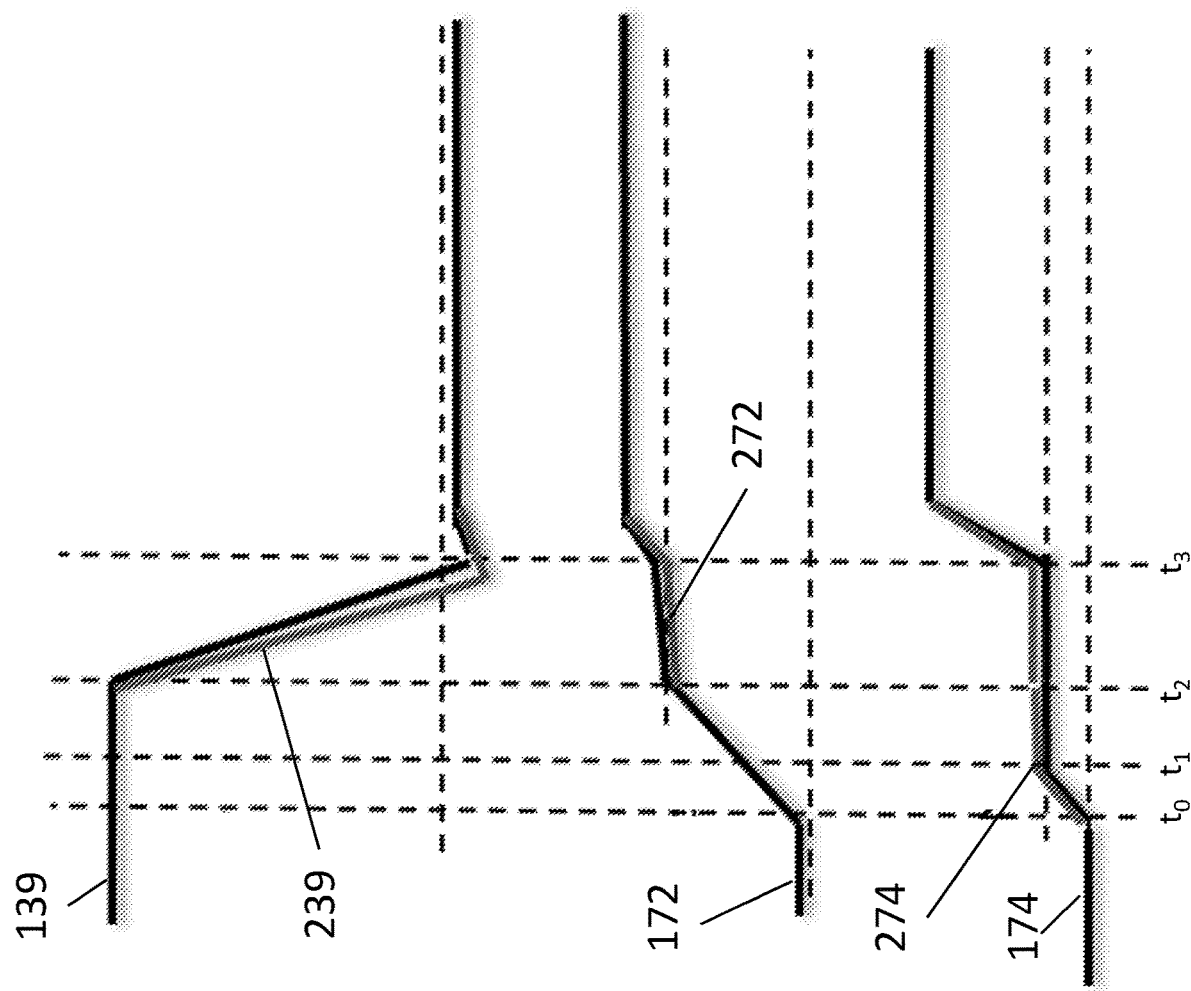

VOLTAGE REDUCING CIRCUIT WITH PRE-BIASING CIRCUIT PORTION

CROSS REFERENCE TO RELATED APPLICATIONS

This is the U.S. National Stage of International Application No. PCT/GB2017/052701, filed Sep. 13, 2017, which was published in English under PCT Article 21(2), which in turn claims the benefit of Great Britain Application No. 1615625.9, filed Sep. 14, 2016.

The present invention relates to DC-DC converters, particularly although not exclusively DC-DC voltage reducers such as synchronous DC-DC buck converters.

Modern portable electronic devices are typically provided with a power source such as a battery that acts as a direct current (DC) power supply for the various electronic components within the device. However, typically these components will have different voltage requirements and so it is conventional for such devices to employ one or more DC-DC converters that step a nominal voltage associated with the power supply down to a voltage appropriate for the different electronic components. While this could be achieved by using a potential divider network (e.g. a series of resistors) to create a number of "taps" having different voltages, this is highly inefficient as energy is simply wasted as heat dissipated across the resistors.

One alternative arrangement known in the art per se is a buck converter. A buck converter circuit utilises an inductor-capacitor or "LC" circuit which is periodically connected to and disconnected from the power supply (e.g. by intermittently opening and closing a switch, typically implemented as a transistor referred to as the "high-side" transistor) by a driver in order to step down the voltage. This can be seen as an electrical equivalent to a mechanical flywheel, wherein energy is periodically input to the system to keep it outputting energy at a steady rate. The ratio of the output voltage to the input voltage can be adjusted by altering the duty cycle of a pulse width modulated (PWM) drive signal produced by the driver that is applied to the gate of the high-side transistor in order to open and close it.

A synchronous buck converter circuit replaces what is known as the "freewheeling" or "flyback" diode with a second transistor, often referred to as the "low-side" transistor. The driver then closes the low-side transistor when opening the high-side transistor and vice versa by applying appropriate PWM drive signals to the high- and low-side transistors to open and close them so as to intermittently couple the LC circuit to the input voltage. This improves the efficiency of the buck converter in exchange for increasing the bill of materials associated with the circuit. However, such a driver must prevent both switches from being turned on at the same time else an issue referred to as "shoot-through" will occur wherein a surge of current flows as the high- and low-side transistors which are both conducting act as a short circuit across the power supply. One method to avoid shoot-through is to utilise a time delay between opening the high-side transistor and closing the low-side transistor, and vice versa. However, in order to ensure that both transistors are never closed at the same time this time delay will result in excess power loss, and thus a loss in efficiency.

An improved method known in the art per se is known as "non-overlap" operation in which the voltage at the switch node (i.e. the point where the high-side transistor, low-side transistor and the inductor of the LC circuit are connected to one another) is monitored. The time delay between the switching on of the one transistor after the other is switched off is measured from the point at which the voltage at the switch node exceeds or drops below a particular threshold as appropriate (depending on whether the transistor turning of is n-type or p-type). Such synchronous drivers can adjust to different types of transistors or switches without the loss in efficiency such flexibility would cause with a fixed non-overlap times.

However, the Applicant has appreciated that improvements can be made in order to further enhance the efficiency of synchronous buck converters and similar arrangements. While the non-overlap topologies guarantee prevention of shoot-through, such converters require the drivers that open and close the high-side and low-side transistors to be relatively fast in order to limit the amount of "dead time" between voltage states at the switch node. However, using sufficiently fast drivers requires relatively large peak currents which introduce unwanted noise into the output voltage, reducing the efficiency of the converter.

Furthermore, with a positive current flowing through the buck converter, the body diode (sometimes referred to as the bulk diode) within the low-side transistor typically conducts during both high-to-low and low-to-high transitions, introducing further noise and degrading the efficiency of the converter. Such conventional buck converters also suffer from a relatively large "undershoot", in which the voltage at the switch node temporarily exceeds the body diode threshold voltage of one of the transistors (typically around 0.7 V) which causes the body diode within the transistor to conduct, which causes bulk diode and substrate currents to flow therethrough—a yet further source of noise and inefficiency within conventional converters.

When viewed from a first aspect, the present invention provides a voltage reducing circuit comprising:
 a power switch circuit portion comprising a high-side field-effect-transistor and a low-side field-effect-transistor arranged in series such that the drain terminals of each of said high-side and low-side transistors are connected at a switch node, the power switch circuit portion having an on-state wherein the high-side transistor is enabled and the low-side transistor is disabled and an off-state wherein the high-side transistor is disabled and the low-side transistor is enabled;
 an input voltage connected across said high-side and low-side transistors;
 an energy storage circuit portion comprising an inductor, said energy storage circuit portion being connected to the switch node and arranged to provide an output voltage;
 a drive circuit portion arranged to receive a pulse width modulated control signal and output first and second pulse width modulated drive signals; and
 a pre-biasing circuit portion connected to the power switch circuit portion, arranged to apply first and second bias voltages to the gate terminals of the high-side and low-side transistors respectively in response to the pulse width modulated drive signals, wherein the pre-biasing circuit portion is arranged such that the bias voltage applied to the gate terminal of the currently disabled transistor is set to an intermediate voltage before switching between the on-state and the off-state.

Thus it will be appreciated by those skilled in the art that in accordance with the present invention, there is a provided a voltage reducing circuit which is suitable for synchronous buck converter implementations. A pre-biasing circuit portion applies bias voltages to the high-side and low-side transistors. Preferably the bias voltages are applied such that the transistor due to conduct following a transition in the pulse width modulated (PWM) control signal is "pre-biased" to the "brink" of conducting and thus can switch on very quickly using only a relatively small current. By reducing the peak currents associated with transitions at the switch node, the amount of noise is reduced, increasing the efficiency of the converter.

Those skilled in the art will appreciate that a voltage reducing circuit in accordance with the present invention achieves the desired reduction in voltage by intermittently coupling and decoupling the energy storage circuit portion to the input voltage. The output current is alternately sourced from the input voltage supply and the energy storage portion, and the degree to which the voltage is reduced depends on the PWM control signal, e.g. a duty cycle thereof.

However, it will be seen that the output voltage may have an associated "ripple" component where it fluctuates around the desired nominal value. In at least some preferred embodiments, the energy storage circuit portion comprises a capacitor. This capacitor may act to "smooth" the output voltage in order to provide a more steady output voltage.

A voltage reducing circuit in accordance with the present invention may, at least in preferred embodiments, also reduce undershoot at the switch node and the amount of body diode biasing which improves the noise performance and in turn the efficiency of the converter.

It will be appreciated that the on- and off-states referred to hereinabove correspond to the gate-source voltage applied to the field-effect-transistor (FET) being substantially above or below the characteristic threshold voltage of said FET. Of course in practice, the nominal threshold voltage will depend on the properties of the FET itself, including its semiconductor structure, doping level, oxide thickness channel length, etc.

In some embodiments, the intermediate voltage is the threshold voltage of the currently disabled transistor. In such embodiments, following a negative transition in the pulse width modulated input signal (signifying that the energy storage circuit portion should be decoupled from the input voltage), the second bias voltage increases to but does not exceed the threshold voltage of the low-side transistor until the first bias voltage exceeds the high-side transistor's own threshold voltage (so as to disable it). Once the high-side transistor is disabled, the second bias voltage can then be further increased so as to switch on the low-side transistor. Similarly, following a positive transition in the pulse width modulated input signal (signifying that the energy storage circuit portion should be coupled to the input voltage), the first bias voltage decreases to but does not fall below the threshold voltage of the high-side transistor until the second bias voltage falls below the threshold voltage of the low-side transistor.

In such embodiments, the pre-biasing circuit portion is arranged so as to bring the currently disabled transistor to the brink of conducting such that when the other, currently conducting, transistor is disabled, the currently non-conducting transistor can be enabled relatively quickly while requiring relatively little current. The time that would be dead time in conventional circuits can then be utilised to reduce the slew rate associated with (i.e. the rate of change of) the voltage at the switch node. By reducing the magnitude of the change in gate-source voltage required to get the non-conducting transistor to conduct, this change can be made over a longer period of time, "slowing down" the transition, reducing the amount of noise generated and increasing the efficiency of the converter.

While it will be appreciated by those skilled in the art that there are a number of field-effect-transistor technologies which could readily be used to implement embodiments of the present invention described herein, in some preferred embodiments the high-side field-effect-transistor comprises a p-channel metal-oxide-semiconductor field-effect-transistor and the low-side field-effect-transistor comprises an n-channel metal-oxide-semiconductor field-effect-transistor.

In some embodiments the pre-biasing circuit portion comprises:
  a switch bias circuit portion arranged to drive the bias voltage applied to the gate terminal of the currently disabled transistor to the intermediate voltage and switch the power switch circuit portion between the on-state and the off-state; and
  a feedback circuit portion arranged to provide at least one further bias voltage to the switch bias circuit, wherein the at least one further bias voltage is dependent on the current through at least one of the high- and low-side field-effect-transistors. Thus it will be seen that, in such embodiments of the present invention, the feedback circuit portion is used to vary a bias voltage used internally by the switch bias circuit portion, which in turn provides the appropriate bias voltages to the high- and low-side field-effect-transistors.

While it will be appreciated by those skilled in the art that there are a number of suitable circuit topologies that could be used to implement the switch bias circuit portion, in some such embodiments the switch bias circuit portion comprises:
  first biasing p-channel and n-channel field-effect transistors arranged in parallel such that:
    the drain terminal of the first biasing p-channel field-effect-transistor is connected to the source terminal of the first biasing n-channel field-effect-transistor and to the gate terminal of the high-side field-effect-transistor; and
    the source terminal of the first biasing p-channel field-effect-transistor is connected to the drain terminal of the first biasing n-channel field-effect-transistor and to the gate terminal of the low-side field-effect-transistor; and
  a second biasing p-channel field-effect-transistor arranged such that its drain terminal is connected to the drain and source terminals of the first biasing p-channel and n-channel field-effect-transistors respectively; and
  a second biasing n-channel field-effect-transistor arranged such that its drain terminal is connected to the source and drain terminals of the first biasing p-channel and n-channel field-effect-transistors respectively,
  wherein the pulse width modulated drive signals are provided to the gate terminals of the second biasing p-channel and n-channel transistors.

Similarly, it will be appreciated that there are also a number of suitable topologies for implementing the feedback circuit portion. However, in at least some embodiments, the feedback circuit portion comprises:
  a first bias feedback circuit portion comprising a feedback p-channel field-effect transistor arranged such that its drain terminal is connected to a first current source and to the gate terminal of the first biasing p-channel field-effect transistor; and
  a second bias feedback circuit portion comprising at least one feedback n-channel field-effect transistor arranged such that its drain terminal is connected to a second current source and to the gate terminal of the first biasing n-channel field-effect transistor, wherein the first and second current sources produce a feedback current equal to an offset current plus a scaled current proportional to the current flowing through at least one of said high-side and low-side transistors. In some such embodiments, the offset current is proportional to a rated output current of the voltage reducing circuit. For example, the offset current may be 1/1000 of the rated output current of the voltage reducing circuit—i.e. if the rated output current of the voltage reducing circuit is 10 mA, the offset current is 10 µA. Similarly, the scaled current may be 1/1000 of the current flowing through the high- or low-side transistors. Thus the feedback current would be equal to the sum of the 10 µA offset current and 1/1000 of the current flowing through the power switch circuit portion. In some embodiments, the second current source is a current mirror arranged to produce substantially the same current as the first current source.

It will be appreciated that there are a number of circuit portion arrangements known in the art per se suitable for generating the pulse width modulated drive signals. However in at least some embodiments, the drive circuit portion comprises a latch circuit portion. In some further embodiments, the latch circuit portion comprises first and second logic gates each having at least first and second inputs, wherein said first and second logic gates are arranged such that:
the first input of the first logic gate is connected to the pulse width modulated input signal;
the first input of the second logic gate is connected to the pulse width modulated control signal;
the output of the first logic gate is connected to the second input of the second logic gate; and
the output of the second logic gate is connected to the second input of the first logic gate. In some such embodiments, the output of each gate is connected to the second input of the other gate via a buffer. These buffers increase the propagation delay to prevent the latch circuit portion from entering the forbidden state wherein the second inputs of each gate are both logic low, increasing the stability of the circuit portion. In a set of preferred embodiments, the first logic gate comprises a two input Boolean NAND gate and the second logic gate comprises a two input Boolean NOR gate. It will of course be appreciated by those skilled in the art that the latch circuit portion could instead be readily implemented using logically equivalent arrangements.

In some embodiments, the first and second bias voltages are dependent on a current flowing through at least one of said high-side and low-side transistors. This provides adaptive biasing which advantageously reduces undershoot.

The Applicant has appreciated that the general principle of pre-biasing the transistors used to intermittently couple and decouple the energy storage circuit portion from the input voltage with a view to reducing the slew rate of the voltage at the switch node is novel and inventive in its own right. Accordingly, when viewed from a second aspect, the present invention provides a method of operating a voltage reducing circuit comprising a high-side field-effect-transistor, a low-side field-effect-transistor and an energy storage circuit portion connected therebetween, the method comprising:
receiving a pulse width modulated input signal;
increasing a second bias voltage to a first voltage level following a negative transition in the pulse width modulated input signal until a first bias voltage exceeds a first voltage threshold, upon which further increasing the second bias voltage to a second voltage level;
decreasing the first bias voltage to a third voltage level following a positive transition in the pulse width modulated input signal until the second bias voltage falls below a second voltage threshold, upon which further decreasing the first bias voltage to a fourth voltage level; and
applying said first and second bias voltages to the gate terminals of the high-side and low-side field-effect-transistors respectively so as to intermittently couple the energy storage circuit portion to the input voltage.

Certain embodiments of the invention will now be described, by way of example only, with reference to the accompanying drawings in which:

FIG. 4 shows a timing diagram illustrating signal transitions typical of the buck converter shown in FIG. 3; and FIG. 5 shows a timing diagram illustrating signal transitions typical of the buck converter shown in FIG. 3 when used with an increased output current.

Figure 1:
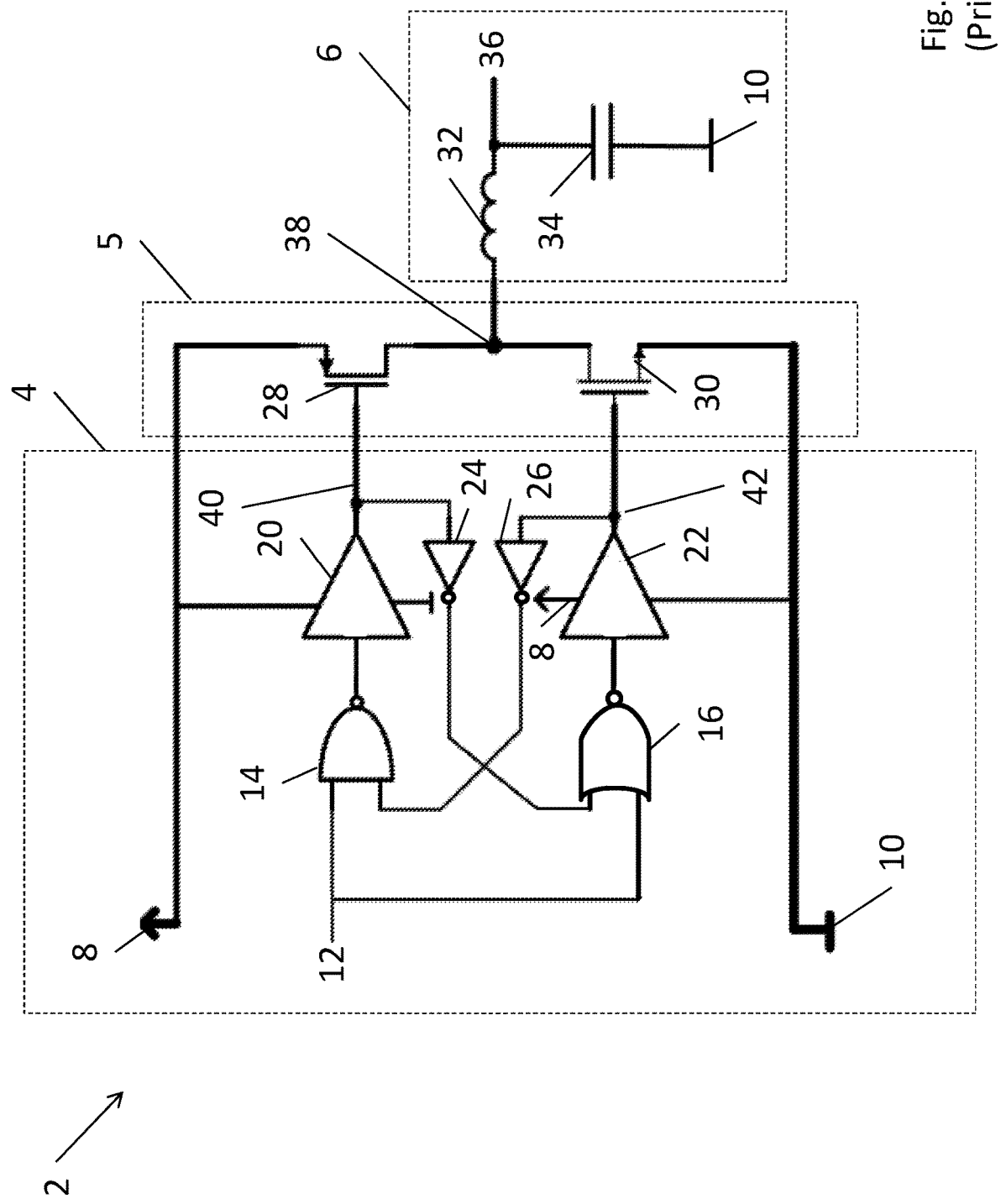
FIG. 1 shows a conventional synchronous DC-DC buck converter for reference purposes only.

FIG. 1 shows a conventional "non-overlapped" synchronous DC-DC buck converter 2. For ease of reference, the buck converter 2 shown in FIG. 1 has been divided up into a drive circuit portion 4, a power-switch circuit portion 5 and an energy storage circuit portion 6. The buck converter 2 is arranged to step an input voltage 8 down to an output voltage 36, wherein the ratio of these two voltages 8, 36 is proportional to the duty cycle of a pulse width modulated (PWM) control signal 12 as will be explained below.

The drive circuit portion 4 includes a latch circuit constructed from a Boolean NAND gate 14 and a Boolean NOR gate 16, the outputs of which are fed into high-side and low-side driving amplifiers 20, 22 respectively. The output 40 of the high-side amplifier 20 (which takes the output of the NAND gate 14 as an input) is then coupled to the second input of the NOR gate 16 via an inverter 24. Similarly, the output 42 of the low-side amplifier 22 (which takes the output of the NOR gate 16 as an input) is then coupled to the second input of the NAND gate 14 via a further inverter 26. Each of the NAND and NOR gates 14, 16 has an input coupled to the PWM control signal 12.

The outputs of the high-side amplifier 20 and low-side amplifier 22 are then applied to the gate terminals of a high-side p-channel field-effect-transistor (FET) 28 and an n-channel low-side field-effect-transistor (FET) 30 respectively. These high- and low-side FETs 28, 30 are arranged in series as a power-switch circuit portion 5, such that their respective drain terminals are connected at a switch node 38, to which the energy storage circuit portion 6 is connected as will be described in further detail below. The source terminal of the high-side FET 28 is connected to the input voltage 8 and the source terminal of the low-side FET 30 is connected to ground 10, i.e. the input voltage is connected across the power-switch circuit portion 5.

The energy storage circuit portion comprises an inductor-capacitor or "LC" filter circuit, including an inductor 32 connected to the switch node 38 by one of its terminals. The other terminal of the inductor 32 is then connected to one terminal of a capacitor 34, which in turn has its other terminal connected to ground 10. An output voltage is then taken from an output node 36 situated between the inductor 32 and the capacitor 34.

Thus it will be seen that the latch circuit within the drive circuit portion 4 takes the PWM control signal 12 and generates complementary PWM signals 40, 42 via the outputs of the high- and low-side amplifiers 20, 22 respectively. The two PWM drive signals 40, 42 do not undergo transitions at the same time and so prevent both transistors 28, 30 being enabled at the same time. These PWM drive signals 40, 42 intermittently (periodically if the PWM control signal 12 is periodic) cause the power-switch circuit portion 5 to switch between an on-state and an off-state. In the on-state the high-side FET 28 is enabled and the low-side FET 30 is disabled, pulling the voltage at the switch node 38 up to the input voltage 8. In the off-state the high-side FET 28 is disabled and the low-side FET 30 is enabled, pulling the voltage at the switch node 38 down to ground 10. This intermittent switching between the on- and off-states of the power-switch circuit portion 5 causes the energy storage circuit portion 6 to be intermittently coupled to and decoupled from the input voltage 8.

Figure 2:
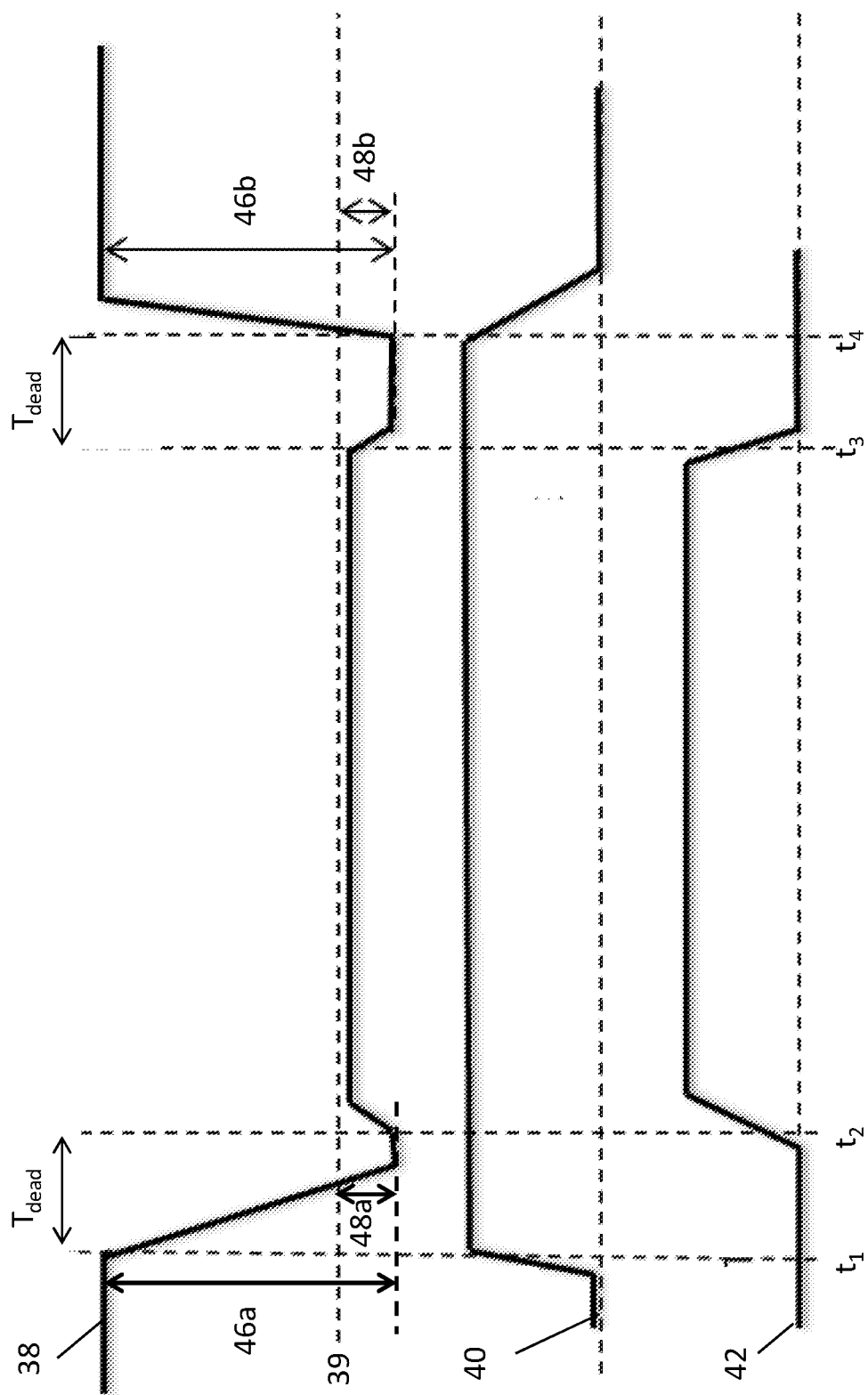
FIG. 2 shows a timing diagram illustrating signal transitions typical of the buck converter shown in FIG. 1.

Operation of the buck converter 2 shown in FIG. 1 will be described with reference to the timing diagram of FIG. 2.

Generally, when the buck converter 2 is first switched on, the power-switch circuit portion 5 starts in the off-state and the current in the energy storage circuit portion 6 is zero. After the first positive transition in the PWM control signal 12, the power-switch circuit portion 5 will be switched to the on-state and the current will increase in response. The inductor 32 will subsequently produce a voltage in response to the time-varying current. This voltage drop counteracts the voltage of the source and therefore reduces the voltage at the output 36. Over time, the rate of change of current decreases, and the voltage across the inductor 32 also decreases accordingly. This increases the voltage at the output 36. Throughout this process, the inductor 32 generates a magnetic field. If the power-switch circuit portion 5 is switched to the off-state (decoupling the energy storage circuit portion 6 from the input voltage 8) while the current is changing, there will necessarily always be a voltage drop across the inductor 32 and therefore the voltage at the output 36 will always be less than the input voltage 8. In fact, as will be shown below with reference to Equations 1 to 10, it typically follows that the ratio of the output voltage 36 to the input voltage 8 is directly proportional to the duty cycle of the PWM control signal 12—i.e. if the duty cycle is 60%, the output voltage 36 will be 60% of the input voltage 8.

The operation of an ideal buck converter is shown mathematically below with reference to Equations 1 to 10, wherein:

$V_L$ is the voltage across the inductor 32;
$V_i$ is the input voltage 8; $V_o$ is the output voltage 36;
L is the inductance of the inductor 32;
$I_L$ is the current through the inductor 32;
E is the energy stored in the inductor 32;
$t_{on}$ is the duration for which the switch circuit portion 5 is in the on-state;
$t_{off}$ is the duration for which the switch circuit portion 5 is in the off-state;
T is the total period of the voltage cycle at the switch node 38; D is the duty cycle of the voltage cycle at the switch node 38;
$\Delta I_{L_{on}}$ is the change in current while the switch circuit portion 5 is in the on-state; and
$\Delta I_{L_{off}}$ is the change in current while the switch circuit portion 5 is in the off-state.

Firstly, from Kirchoff's voltage law, during the on-state the voltage $V_L$ across the inductor 32 must be the same as the difference between the input voltage 8 ($V_i$) and the output voltage 36 ($V_o$) as per Eq. 1:

$$V_L = V_i - V_o$$

Equation 1: Voltage across the inductor 32 while switch circuit portion 5 is in the on-state. The current through the inductor 32 will rise linearly during this time.

Similarly, during the off-state the voltage $V_L$ across the inductor 32 must be equal in magnitude to the output voltage 36 ($V_o$) but of the opposite sign as per Eq. 2:

$$V_L = -V_o$$

Equation 2: Voltage across the inductor 32 while switch circuit portion 5 is in the off-state. The current through the inductor 32 will decrease during this time.

The characteristic equation for the relationship between energy stored in the inductor 32 and the current therethrough is given below in Eq. 3:

Energy stored in the inductor 32.

$$E = \frac{LI_L^2}{2} \qquad \text{Equation 3}$$

Thus it will be seen that the energy stored in the inductor 32 increases during the on-state as the current $I_L$ therethrough increases. Conversely, the energy stored in the inductor 32 decreases during the off-state as it is used to transfer energy to the output of the buck converter 2. The rate of change of the current $I_L$ through the inductor 32 is then related to the voltage $V_L$ across the inductor 32 as per Eq. 4:

Characteristic voltage-current equation of the inductor 32.

$$V_L = L \frac{dI_L}{dt} \qquad \text{Equation 4}$$

Then by integrating Eq. 4 during the on-state, the total change in current during the on-state can be found as shown in Eq. 5:

Increase in current through the inductor during the on-state.

$$\Delta I_{L_{on}} = \int_0^{t_{on}} \frac{V_L}{L} \cdot dt = \left(\frac{V_i - V_o}{L}\right) t_{on}, \; t_{on} = DT \qquad \text{Equation 5}$$

Similarly, by integrating Eq. 4 during the off-state, the total change in current during the off-state can be found as shown in Eq. 6:

Decrease in current through the inductor during the on-state.

$$\Delta I_{L_{off}} = \int_{t_{on}}^{T=t_{on}+t_{off}} \frac{V_L}{L} \cdot dt = \left(\frac{-V_o}{L}\right) t_{off}, \; t_{off} = (1-D)T \qquad \text{Equation 6}$$

Assuming that the buck converter 2 operates in the steady state, the energy stored at the end of the period T must be equal to that at the beginning of the period.

Steady state condition $$\frac{V_i - V_o}{L} t_{on} - \frac{V_o}{L} t_{off} = 0 \qquad \text{Equation 7}$$

Since $t_{on}$=DT and $t_{off}$=(1−D)T as per Eqs. 5 and 6, these relationships can be substituted into Eq. 7 in order to obtain Eq. 8:

$$(V_i - V_o)DT - V_o(1-D)T = 0$$

Equation 8: Steady state condition.
Rearranging Eq. 8 further yields Eq. 9 below:

$$V_o - DV_i = 0$$

Equation 9: Steady state condition.
Which in turn yields Eq. 10 below, from which it can be seen how the ratio of the output voltage 36 ($V_o$) to the input voltage 8 ($V_i$) is directly proportional duty cycle D of the PWM control signal 12:

Relationship between input voltage and output voltage as a function of the duty cycle.

$$D = \frac{V_o}{V_i} \qquad \text{Equation 10}$$

During normal operation however, there are issues caused by the transitions of the PWM control signal 12, as will be described with reference to FIG. 2. Once the buck converter 2 has been operating normally for some time, the PWM control signal 12 undergoes a negative transition—i.e. it falls from its logic high value to its logic low value—which should consequentially drive the voltage at the switch node 38 to its logic low state in order to decouple the energy storage circuit portion 6 from the input voltage 8.

Initially, at time $t_1$, the voltage 40 applied to the gate terminal of the high-side FET 28 increases, which switches off the high-side FET 28. After an amount of dead time, $T_{dead}$, the voltage 42 applied to the gate terminal of the low-side FET 30 then begins to rise at $t_2$. This switches the low-side FET 30 on, which in turn pulls down the voltage at the switch node 38, decoupling the energy storage circuit portion 6 from the input voltage 8. However, it can be seen that just prior to $t_2$, the voltage at the switch node 38 experiences an undershoot by an amount 48*a*—i.e. the voltage at the switch node 38 falls below its final value 39 before reaching it sometime later. The total peak-to-peak voltage 46*a* of the voltage at the switch node 38, generating switching noise associated with the buck converter 2.

Similarly at a subsequent time $t_3$, the PWM control signal 12 undergoes a positive transition and accordingly the voltage 42 applied to the gate terminal of the low-side FET 30 decreases, which switches off the low-side FET 30. After a further amount of dead time, $T_{dead}$, the voltage 40 applied to the gate terminal of the high-side FET 28 then begins to rise at $t_4$. This switches the high-side FET 28 on, which in turn pulls up the voltage at the switch node 38, coupling the energy storage circuit portion 6 to the input voltage 8. Once again however, just after $t_3$, the voltage at the switch node 38 experiences an undershoot by an amount 48*b*. It should of course be appreciated that in practice, the amount of under-shoot 48*b* and the corresponding peak-to-peak voltage 46*b* associated with positive transitions may be different to the undershoot 48*a* and peak-to-peak voltage 48*a* associated with negative transitions.

Figure 3:
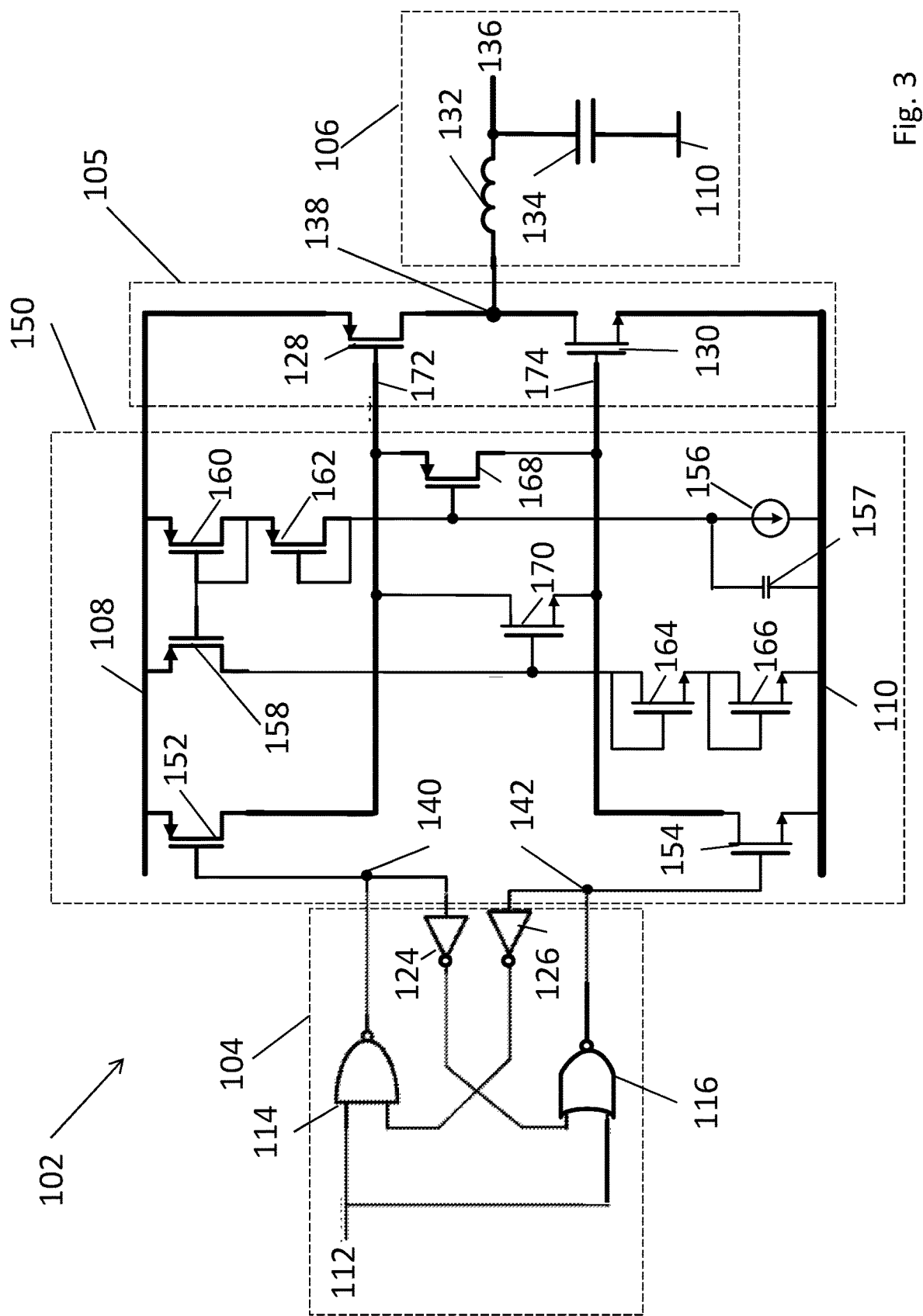
FIG. 3 shows a synchronous DC-DC buck converter in accordance with an embodiment of the present invention.

FIG. 3 shows a synchronous DC-DC buck converter in accordance with an embodiment of the present invention. For reference, the buck converter 102 shown in FIG. 3 has also been divided up into a drive circuit portion 104, a power-switch circuit portion 105 and an energy storage circuit portion 106. However, when compared to the conventional "non-overlapping" circuit shown in FIG. 1, the buck converter 102 of FIG. 3 has an additional pre-biasing circuit portion 150 and the driving amplifiers 20, 22 from FIG. 1 have been removed. Similarly, the buck converter 102 is arranged to step an input voltage 108 down to an output voltage 136. The ratio of these two voltages 108, 136 is proportional to the duty cycle of a pulse width modulated (PWM) control signal 112. However, as will be described below, the buck converter 102 has less noise associated with it than conventional circuits such as the buck converter 2 described previously with reference to in FIG. 1.

As previously described with reference to FIG. 1, the drive circuit portion 105 produces first and second PWM drive signals 140, 142 from the PWM control signal 112. However, instead of being applied directly to the gate terminals of the high-side and low-side transistors 28, 30 within the power-switch circuit 5 as in FIG. 1, they are instead input to the pre-biasing circuit portion 150 as will be described below.

The pre-biasing circuit portion 150 includes a first biasing p-channel FET 168 and a first biasing n-channel FET 170 arranged in parallel such that the drain terminal of the first biasing p-channel FET 168 is connected to the source terminal of the first biasing n-channel FET 170. Similarly, the source terminal of the first biasing p-channel FET 168 is connected to the drain terminal of the first biasing n-channel FET 170. The drain terminal of the first biasing p-channel FET 168 and the source terminal of the first biasing n-channel FET 170 are both connected to the gate terminal of the high-side FET 128. Likewise, the source terminal of the first biasing p-channel FET 168 and the drain terminal of the first biasing n-channel FET 170 are both connected to the gate terminal of the low-side FET 130.

A second biasing p-channel FET 152 is arranged such that its drain terminal is connected to the source terminal of the first biasing p-channel FET 168 and to the drain terminal of the first biasing n-channel FET 170. The source terminal of the second biasing p-channel FET 152 is connected to the input voltage 108. A second biasing n-channel FET 154 is similarly arranged such that its drain terminal is connected to the drain terminal of the first biasing p-channel FET 168 and to the source terminal of the first biasing n-channel FET 170. The first and second PWM drive signals 140, 142 are then applied to the gate terminals of the second biasing p-channel and n-channel FETs 152, 154.

The pre-biasing circuit portion 150 also includes a first feedback circuit portion constructed from two feedback p-channel FETs 160, 162 arranged in series in the diode-connected mode (i.e. the gate terminal of each FET is connected to its own drain terminal). The drain terminal of the "downstream" feedback p-channel FET 162 is connected to a current source 156 and to the gate terminal of the first biasing p-channel FET 168. A second bias feedback circuit portion constructed from two feedback n-channel FETs 164, 166 which are similarly arranged in series in the diode-connected mode. The drain terminal of the "upstream" feedback n-channel FET 164 is connected to a current mirror transistor 158 and to the gate terminal of the first biasing n-channel FET 170. The current mirror transistor 158 is arranged to provide the same current to the second bias feedback portion as that flowing through the first bias feedback portion.

The current source 156 (and by extension the mirror transistor 158) produces a feedback current dependent on the current flowing through at least one of the high-side and low-side transistors 128, 130—in this example they produce the same current as that flowing through the high-side FET 128. In this particular example, the current source 156 produces a feedback current equal to $\frac{1}{1000}$ of the rated output current of the buck converter 102 (in this case, 10 mA) plus $\frac{1}{1000}$ of the current through the high-side FET 128—i.e. the feedback current is 10 µA plus $\frac{1}{1000}$ of the current through the high-side FET 128. A filter capacitor 157 is shown in parallel with the current source 156 which illustrates that the dependent portion of this feedback current has a time constant of typically several switching cycles.

Operation of this buck converter 102 will now be described with reference to FIG. 4 which shows a timing diagram of typical signal transitions. Firstly with regard to a negative transition in the PWM control signal 112 at time $t_0$, the drive circuit portion 104 sets the voltage 140 to logic low, which switches on the second bias p-channel FET 152. As the second bias p-channel FET 152 is now open, the voltage 172 applied to the gate terminal of the high-side FET 128 begins to increase. The voltage 174 applied to the gate terminal of the low-side FET 130 also begins to rise, but only to the threshold voltage 178 of the low-side FET 30 which it reaches at time $t_1$. At this point in time, the low-side FET 130 is biased very lightly such that it is on the brink of fully conducting, but the high-side FET 128 is still fully enabled. As the low-side FET 130 is biased at its threshold voltage 178, it can be fully enabled at a later time very quickly without requiring a large driver current.

At time $t_2$, the voltage 172 applied to the gate terminal of the high-side FET 128 increases beyond its own threshold voltage 176. This disables the high-side FET 128 which causes the voltage 139 at the switch node 138 to start decreasing as it is no longer directly connected to the input voltage 108. At the same time, the voltage 174 applied to the gate terminal of the low-side FET 130 is pulled up by the first biasing p-channel FET 168. Between times $t_2$ and $t_3$, the slew rate of the switch node 138 itself and the Miller capacitances associated with the high- and low-side FETs 128, 130 retard the switching of the power-switch circuit portion 105 from its on-state to its off-state. This also reduces the amount of undershoot associated with transitions between the on- and off-states. Furthermore, by selecting the size of the second biasing p-channel FET 152 appropriately, the rate at which the second biasing p-channel FET 152 can pull up the voltage 172 applied to the gate terminal of the high-side FET 128 is limited by the gate-drain capacitance of the high-side FET 128 which acts to pull down the voltage 172. Thus, the greater the voltage 172 applied to the gate terminal of the high-side FET 128, the faster the slew rate of the voltage 139 at the switch node 138.

After time $t_3$, the voltage 172 applied to the gate terminal of the high-side FET 128 has settled at its final value 173 (and the high-side FET 128 is disabled accordingly) and the voltage 174 applied to the gate terminal of the low-side FET 130 then begins increasing further towards its own final value 177 at which it settles (and the low-side FET 130 is thus enabled). While the voltage 139 at the switch node 138 does experience a slight undershoot 148a around time $t_3$, it can be seen that this is reduced when compared to the undershoot 48a shown in FIG. 2.

The voltage 139 at the switch node 138 then remains at its final, logic low value 141 until a subsequent time $t_4$, at which the PWM control signal 112 undergoes a positive transition which causes the drive circuit portion 104 to set the voltage 142 to logic high, which in turn enables the second bias n-channel FET 154. As current is permitted to flow through this FET 154, the voltage 174 applied to the gate terminal of the low-side transistor 130 is pulled down. The voltage 172 applied to the gate terminal of the high-side FET 128 begins to decrease, but only to the threshold voltage 176 of the high-side FET 128 which it reaches at time $t_5$. Shortly after the positive transition of the PWM control signal 112, the voltage 139 at the switch node 138 experiences an undershoot 148b at $t_6$. However, as before, it can be seen that the magnitude of this undershoot 148b is reduced compared to the undershoot 48b shown in FIG. 2. While the undershoot 48b associated with a conventional buck converter is typically equal to the body diode threshold voltage (which is typically around 0.7 V), the undershoot 148b experienced by the voltage 139 at the switch node 138 of the buck converter 102 of the present invention can be limited to around 300 mV.

Typically, the p-channel, high-side FET 128 is wider and thus has a larger gate capacitance than the n-channel, low-side FET 130. This means that the slew rate of the high-side FET 128 cannot match the slew rate of the low-side FET 130, and thus the voltage 172 at the gate terminal of the high-side FET 128 decreases at a slower rate than the voltage 174 at the gate terminal of the low-side FET 130. Also, as the voltage 174 applied to the gate terminal of the low-side transistor 130 has been pulled down, the bias voltage applied to the gate terminal of the first bias p-channel FET 168 undergoes a "bounce down" due to the gate-drain capacitance of the FET 168.

While at this point both the high- and low-side FETS 128, 130 are enabled, the relatively fast slew rate of the low-side FET 130 and the relatively slow slew rate of the high-side FET 128 ensure that there is not sufficient time for shoot-through to occur through the power-switch circuit portion 105.

At a subsequent time $t_6$, the voltage 174 applied to the gate terminal of the low-side FET 30 falls below its threshold voltage 178. At this time, the voltage 139 at the switch node 138 initially begins to fall due to the current through the energy storage circuit portion 106, however the high-side FET 128 is already enabled (enhanced due to the voltage 172 applied to the gate terminal of the high-side FET 128 being pulled down by the first bias n-channel FET 170) and thus the high-side FET 128 starts to pull up the voltage at the switch node 138. As the high-side FET 128 is already pre-biased, it does not take a lot of current to transition from the off-state to the on-state, thus the time that would conventionally be dead time can instead be used to allow for a reduced slew rate, reducing the amount of noise generated by the switching of the power switch circuit portion 105. At time $t_7$, the voltage 139 at the switch node 138 reaches its final logic high value 137.

It will of course be appreciated that the rate at which the high-side FET 128 is enabled, and by extension the rise time of the voltage at the switch node 138, is regulated by the Miller capacitance of the high-side FET 128 against the "strength" of the pre-bias circuit portion 150. The main contribution to the rise time of the voltage 139 and the switch node 138 is the bias applied to the first and second biasing n-channel FETs 154,170. The optimal choice for each of the various parameters such as bias voltages and transistor sizes can of course be achieved using simulation techniques that are known in the art per se.

FIG. 5 shows a timing diagram illustrating signal transitions typical of the buck converter 102 shown in FIG. 3 when used with an increased output current. As the current source 156 produces a current proportional to the current through the high-side FET 128, the bias voltages 272, 274 applied to the gate terminals of the first bias p- and n-channel FETS 268, 270 are increased if the output current is increased compared to the bias voltages 172, 174 applied previously with the lower output current. This causes the voltage 239 at the switch node 138 with a higher output current falls at a faster slew rate (i.e. has a steeper negative gradient) than the voltage 139 at the switch node 138 with a lower output current. While it will be seen that increasing the output current increases undershoot, increasing the bias applied to the low-side FET 130 can reduce the magnitude of this undershoot.

Thus it will be seen that the present invention provides a DC-DC voltage reducing circuit arranged to "pre-bias" the high-side and low-side field-effect-transistors so as to reduce the drive currents and slew rates associated with switching between on- and off-states with a view to reducing noise and increasing efficiency. It will be appreciated by those skilled in the art that the embodiments described above are merely exemplary and are not limiting on the scope of the invention.

The invention claimed is:
1. A voltage reducing circuit comprising:
a power switch circuit portion comprising a high-side field-effect-transistor and a low-side field-effect-transistor, wherein the high-side field-effect-transistor comprises a p-channel metal-oxide-semiconductor field-effect-transistor and the low-side field-effect-transistor comprises an n-channel metal-oxide-semiconductor field-effect-transistor, the high-side field-effect-transistor and the low-side field-effect-transistor being arranged in series such that the drain terminals of each of said high-side and low-side transistors are connected at a switch node;
wherein the power switch circuit portion has an on-state wherein a voltage applied to a gate terminal of the high-side transistor is set to a first value such that the high-side transistor is enabled and a voltage applied to a gate terminal of the low-side transistor is disabled;
wherein the power switch circuit portion has an off-state wherein the voltage applied to the gate terminal of the high-side transistor is set to a third value such that the high-side transistor is disabled and the voltage applied to the gate terminal of the low-side transistor is set to a fourth value such that the low-side transistor is enabled; and
wherein a respective threshold voltage of the high-side transistor is between the first and third values, and wherein a respective threshold voltage of the low-side transistor is between the second and fourth values;
said voltage reducing circuit further comprising:
an input voltage connected across said high-side and low-side transistors;
an energy storage circuit portion comprising an inductor, said energy storage circuit portion being connected to the switch node and arranged to provide an output voltage;
a drive circuit portion arranged to receive a pulse width modulated control signal and output first and second pulse width modulated drive signals; and a pre-biasing circuit portion connected to the power switch circuit portion, arranged to apply first and second bias voltages to the gate terminals of the high-side and low-side transistors respectively in response to the pulse width modulated drive signals, wherein the pre-biasing circuit portion is arranged such that:
when the power switch circuit portion is in the on-state, the bias voltage applied to the gate terminal of the low-side transistor is set to an intermediate voltage before switching to the off-state, wherein said intermediate voltage is between the second value and the threshold voltage of the low-side transistor or wherein the intermediate voltage is the threshold voltage of the low-side transistor; and
when the power switch circuit portion is in the off-state, the bias voltage applied to the gate terminal of the high-side transistor is set to an intermediate voltage before switching to the on-state, wherein said intermediate voltage is between the third value and the threshold voltage of the high-side transistor or wherein the intermediate voltage is the threshold voltage of the high-side transistor.
2. The voltage reducing circuit as claimed in claim 1, wherein the energy storage circuit portion comprises a capacitor.
3. The voltage reducing circuit as claimed in claim 1, wherein the first and second bias voltages are dependent on a current flowing through at least one of said high-side and low-side transistors.
4. The voltage reducing circuit as claimed in claim 1, wherein the pre-biasing circuit portion comprises:
a switch bias circuit portion; and
a feedback circuit portion arranged to provide at least one further bias voltage to the switch bias circuit portion, wherein the at least one further bias voltage is dependent on a current through at least one of the high- and low-side field-effect-transistors;
wherein the switch bias circuit portion arranged such that:
when the power switch circuit portion is in the on-state, the switch bias circuit portion drives the bias voltage applied to the gate terminal of the low-side transistor to the intermediate voltage and switches the power switch circuit portion to the off-state; and
when the power switch circuit portion is in the off-state, the switch bias circuit portion drives the bias voltage applied to the gate terminal of the high-side transistor to the intermediate voltage and switches the power switch circuit portion to the on-state.
5. The voltage reducing circuit as claimed in claim 4, wherein the switch bias circuit portion comprises:
first biasing p-channel and n-channel field-effect transistors arranged in parallel such that:
the drain terminal of the first biasing p-channel field-effect-transistor is connected to the source terminal of the first biasing n-channel field-effect-transistor and to the gate terminal of the high-side field-effect-transistor; and
the source terminal of the first biasing p-channel field-effect-transistor is connected to the drain terminal of the first biasing n-channel field-effect-transistor and to the gate terminal of the low-side field-effect-transistor; and
a second biasing p-channel field-effect-transistor arranged such that its drain terminal is connected to the drain and source terminals of the first biasing p-channel and n-channel field-effect-transistors respectively; and a second biasing n-channel field-effect-transistor arranged such that its drain terminal is connected to the source and drain terminals of the first biasing p-channel and n-channel field-effect-transistors respectively, wherein the pulse width modulated drive signals are provided to the gate terminals of the second biasing p-channel and n-channel transistors.

6. The voltage reducing circuit as claimed in claim 4, wherein the feedback circuit portion comprises:
a first bias feedback circuit portion comprising a feedback p-channel field-effect transistor arranged such that its drain terminal is connected to a first current source and to the gate terminal of the first biasing p-channel field-effect transistor; and
a second bias feedback circuit portion comprising at least one feedback n-channel field-effect transistor arranged such that its drain terminal is connected to a second current source and to the gate terminal of the first biasing n-channel field-effect transistor,
wherein the first and second current sources produce a feedback current equal to an offset current plus a scaled current proportional to the current flowing through at least one of said high-side and low-side transistors.

7. The voltage reducing circuit as claimed in claim 6, wherein the offset current is proportional to a rated output current of the voltage reducing circuit.

8. The voltage reducing circuit as claimed in claim 6, wherein the second current source is a current mirror arranged to produce the same current as the first current source.

9. The voltage reducing circuit as claimed in claim 1, wherein the drive circuit portion comprises a latch circuit portion.

10. The voltage reducing circuit as claimed in claim 9, wherein the drive circuit portion comprises first and second logic gates each having at least first and second inputs, wherein said first and second logic gates are arranged such that:
the first input of the first logic gate is connected to the pulse width modulated control signal;
the first input of the second logic gate is connected to the pulse width modulated control signal;
the output of the first logic gate is connected to the second input of the second logic gate; and
the output of the second logic gate is connected to the second input of the first logic gate.

11. The voltage reducing circuit as claimed in claim 10, wherein the output of each gate is connected to the second input of the other gate via a buffer.

12. The voltage reducing circuit as claimed in claim 10, wherein the first logic gate comprises a two input Boolean NAND gate and the second logic gate comprises a two input Boolean NOR gate.

13. A method of operating a voltage reducing circuit comprising a high-side field-effect-transistor, a low-side field-effect-transistor and an energy storage circuit portion connected therebetween, wherein the high-side field-effect-transistor comprises a p-channel metal-oxide-semiconductor field-effect-transistor and the low-side field-effect-transistor comprises an n-channel metal-oxide-semiconductor field-effect-transistor, the method comprising:
receiving a pulse width modulated input signal;
increasing a second bias voltage to a first voltage level following a negative transition in the pulse width modulated input signal until a first bias voltage exceeds a first voltage threshold;
further increasing the second bias voltage to a second voltage level;
decreasing the first bias voltage to a third voltage level following a positive transition in the pulse width modulated input signal until the second bias voltage falls below a second voltage threshold;
further decreasing the first bias voltage to a fourth voltage level; and
applying said first and second bias voltages to the gate terminals of the high-side and low-side field-effect-transistors respectively so as to couple the energy storage circuit portion to the input voltage intermittently.

* * * * *